(12) United States Patent
Pippers

(10) Patent No.: US 12,336,157 B2
(45) Date of Patent: Jun. 17, 2025

(54) METHOD FOR MANUFACTURING AN ELECTROMAGNETIC SHIELD HOUSING FOR SHIELDING AN ELECTRONIC COMPONENT ON A PRINTED CIRCUIT BOARD AND ELECTROMAGNETIC SHIELD HOUSING

(71) Applicant: Rohde & Schwarz GmbH & Co. KG, Munich (DE)

(72) Inventor: Simon Pippers, Munich (DE)

(73) Assignee: Rohde & Schwarz GmbH & Co., Munich (DE)

( * ) Notice: Subject to any disclaimer, the term of this patent is extended or adjusted under 35 U.S.C. 154(b) by 167 days.

(21) Appl. No.: 18/073,867

(22) Filed: Dec. 2, 2022

(65) Prior Publication Data

US 2024/0188264 A1 Jun. 6, 2024

(51) Int. Cl.
*H05K 9/00* (2006.01)

(52) U.S. Cl.
CPC ......... *H05K 9/0031* (2022.08); *H05K 9/0015* (2013.01); *H05K 9/0026* (2013.01); *H05K 9/0083* (2013.01)

(58) Field of Classification Search
CPC ..... H05K 9/0015–0018; H05K 9/0022; H05K 9/0026; H05K 9/0031; H05K 9/0032; H01L 23/598; H01L 23/552
USPC .......................... 361/800, 816, 818; 174/520; 257/659–713
See application file for complete search history.

(56) References Cited

U.S. PATENT DOCUMENTS

| | | | | |
|---|---|---|---|---|
| 6,008,536 A * | 12/1999 | Mertol | ................ | H01L 23/367 257/713 |
| 6,573,590 B1 * | 6/2003 | Radu | ................ | H01L 23/49838 257/659 |
| 6,818,821 B2 * | 11/2004 | Fujieda | ................ | H05K 9/0029 977/932 |
| 6,956,285 B2 * | 10/2005 | Radu | ................ | H01L 23/552 257/713 |
| 7,332,797 B2 * | 2/2008 | Matayabas, Jr. | .... | H01L 23/3121 257/E23.125 |
| 7,633,015 B2 * | 12/2009 | Wurzel | ................ | H05K 9/0024 174/260 |
| 8,432,706 B2 * | 4/2013 | Kim | ................ | H05K 9/0052 343/702 |
| 8,969,737 B2 | 3/2015 | Just et al. | | |
| 2006/0272857 A1 * | 12/2006 | Arnold | ................ | H05K 9/0024 361/816 |

(Continued)

FOREIGN PATENT DOCUMENTS

KR   10-2016-0013697 A    2/2016

*Primary Examiner* — Tuan T Dinh
(74) *Attorney, Agent, or Firm* — Westman, Champlin & Koehler, P.A.

(57) ABSTRACT

A method for manufacturing an electromagnetic shield housing for shielding an electronic component on a printed circuit board comprises providing a metallic lid with a shielding chamber at an underside for accommodating and covering the electronic component on the printed circuit board; filling the shielding chamber with an RF-absorber material; and removing RF-absorber material from the shielding chamber until the electronic component fits into the shielding chamber while a ceiling and lateral walls of the shielding chamber remain covered with RF-absorber material.

17 Claims, 5 Drawing Sheets

(56) References Cited

U.S. PATENT DOCUMENTS

| | | | |
|---|---|---|---|
| 2010/0195305 A1* | 8/2010 | Kiyota | H05K 9/0032 |
| | | | 361/818 |
| 2016/0234356 A1* | 8/2016 | Thomas | H04K 3/84 |
| 2017/0090532 A1* | 3/2017 | Koukami | G06F 1/203 |
| 2020/0299969 A1* | 9/2020 | McBride | F16M 13/022 |
| 2021/0375707 A1* | 12/2021 | Teixeira De Queiros | |
| | | | H01L 23/315 |

* cited by examiner

METHOD FOR MANUFACTURING AN ELECTROMAGNETIC SHIELD HOUSING FOR SHIELDING AN ELECTRONIC COMPONENT ON A PRINTED CIRCUIT BOARD AND ELECTROMAGNETIC SHIELD HOUSING

TECHNICAL FIELD

The present invention relates to a method for manufacturing an electromagnetic shield housing for shielding an electronic component on a printed circuit board. The present invention further relates to a respective electromagnetic shield housing as well as to a printed circuit board with such an electromagnetic shield housing.

BACKGROUND

Miniaturization of electronic devices brings along shielding challenges as high-frequency components become more closely spaced. As printed circuit boards (PCBs) shrink, new electromagnetic shielding solutions should provide greater levels of interference suppression, but without significantly adding mass, weight and cost to a device.

In order to avoid unwanted resonances in shielding caps in the passband, or at least to shift them as far as possible to high frequencies, individual components can be placed under their own shielding caps, which may be designed as small as possible. If this is not possible, or if unwanted resonances still occur, these can be sufficiently suppressed by gluing RF damping mats into the top of the shielding caps and/or by dispensing and curing liquid RF-absorber material there. For the frequency ranges realized so far on typical PCBs, mostly only $TEm0p$ resonances occur (E-fields perpendicular to the PCB), which can be sufficiently suppressed with this technique.

With progressive increase of the maximum usable frequency on PCBs, even for very small chambers (e.g. 3×3 mm) not only the rather easily suppressible $TEm0p$ resonances occur, but also lateral $TE0np$ resonances as well as excitations of TM modes may arise. If the respective shielding can or housing cannot be further reduced in size, these unwanted resonances and higher modes could be suppressed by RF absorbers on the walls of the respective housing. Gluing RF damping mats to side walls is however highly impractical.

Moreover, an insulating adhesive layer between a RF damping mat and a conductive shield wall might not sufficiently suppress wall currents.

Prior art document U.S. Pat. No. 8,969,737 B2 describes radio-frequency shielding structures for printed circuit boards.

Prior art document KR 10-2016-0013697 A describes a thin-layer and wide-bandwidth electromagnetic wave absorber.

SUMMARY

Against this background, there is a need to find electromagnetic shielding solutions with improved suppression of electromagnetic resonances and modes at high frequencies.

To this end, the present invention provides a method, an electromagnetic shield housing and a printed circuit board with the features of the independent claims.

According to an aspect of the invention, a method for manufacturing an electromagnetic shield housing for shielding an electronic component on a printed circuit board comprises providing a metallic lid with a shielding chamber at an underside for accommodating and covering the electronic component on the printed circuit board; filling the shielding chamber with an RF-absorber material; and removing RF-absorber material from the shielding chamber until the electronic component fits into the shielding chamber while a ceiling and lateral walls of the shielding chamber remain covered with RF-absorber material.

According to a further aspect of the invention, an electromagnetic shield housing for shielding an electronic component on a printed circuit board comprises a metallic lid configured with a shielding chamber at an underside for accommodating and covering the electronic component on the printed circuit board, wherein the shielding chamber comprises a ceiling and lateral walls covered with RF-absorber material.

According to yet a further aspect of the invention, a printed circuit board has an electronic component attached thereon and an electromagnetic shield housing according to the invention is placed over the electronic component such that the electronic component is accommodated in the shielding chamber of the electromagnetic shield housing and thereby covered by the electromagnetic shield housing.

Thus, one idea of the present invention is to completely fill a chamber within a metallic lid with RF-absorber material in a first step and then subsequently remove most of the respective material again from the chamber such that the walls and the ceiling of the chamber remain covered in damping material but a cavity is now formed in the middle for accommodating an electronic device, e.g. a chip. As walls and ceiling can thus be completely and/or continuously covered by a suitable absorber material, the damping properties of the shield housing may be significantly improved compared to conventional solutions, in particular because gaps in the damping material can be avoided. Moreover, usage of adhesives and the like may be completely dispensed with.

The metallic lid used for the present approach may be manufactured with conventional techniques as they known in art. For example, the metallic lid may be stamp formed and/or injection molded and the shielding chamber and other structures may be introduced subsequently by adequate machining, e.g. cutting, milling, drilling etc. In other embodiments, the metallic lid may also be formed, for example, by additive manufacturing, that is, 3D-printing.

The invention enables the development of assemblies up to 90 GHz and more on printed circuit boards with high integration density and high dynamics, as well as using relatively large surface mounted components. In the solutions known so far, damping mats are glued or dispensed to the top of a shielding chamber, which only allows to adequately suppress $TEm0p$ resonances but not $TE0np$ resonances or TM modes occurring at higher frequencies. The present solution can be realized based on standard machining techniques without the necessity for additional manual production steps.

Further embodiments of the present invention are subject of the subordinate claims and of the following description, referring to the drawings.

According to an embodiment, the RF-absorber material may form a single continuous surface within the shielding chamber across the ceiling and the lateral walls.

Hence, the RF-absorber material may form a single integral portion of the shield housing within the shielding chamber providing optimal properties for the suppression of any occurring high-frequency resonances and modes across the respectively covered electronic component.

According to an embodiment, the RF-absorber material may be filled into the shielding chamber in flowable condition.

Thus, the RF-absorber material may be, for example, a casting or potting material that can be made malleable (e.g. liquefied) and then dispensed into the shielding chamber where it then can be cured into a solid mass. In the next step, the material may then be removed by machining, e.g. milling, to a desired depth within the shielding chamber so that an adequate amount of RF-absorber material remains on the walls and ceiling of the shielding chamber. In case shield walls with RF absorber material should not be required in a specific application, the shielding chamber may also be machined out to the same lateral depth as in the original component.

According to an embodiment, the RF-absorber material may be a polymer composite having a polymer matrix filled with a metal material. The metal material may particularly comprise manganese and/or zinc.

For example, magnetic polymer composites based on polyurethane, epoxy and/or other polymers filled with manganese zinc ferrite (MnZn) or similarly suited metal materials may provide adequate dielectric and magnetic properties for suppression of the respective electromagnetic interferences.

The person of skill will, however, readily employ any other suitable material for the present purpose that provides sufficient electromagnetic damping properties while offering an adequate cost performance ratio.

According to an embodiment, the RF-absorber material may be removed from the shielding chamber by machining, in particular milling.

It is to be understood, however, that the person of skill may readily draw on any suitable subtractive manufacturing method known in the art in order to remove the absorber material to a certain depth and/or width within the shielding chamber.

According to an embodiment, the method may further comprise machining out, in particular milling out, at least one supply channel along the underside of the metallic lid for accommodating respective electromagnetic signal lines, the at least one supply channel running from a lateral edge of the metallic lid into the shielding chamber through the RF-absorber material of the walls of the shielding chamber. Accordingly, the electromagnetic shield housing may comprise at least one supply channel being formed along the underside of the metallic lid for accommodating respective electromagnetic signal lines, the at least one supply channel running from a lateral edge of the metallic lid into the shielding chamber through the RF-absorber material of the walls of the shielding chamber.

Hence, in a first step a shield housing may be manufactured, e.g. by conventional means like machining, including the shielding chamber but with the exception of the RF-channels, which are omitted first. In a second step, the shielding chamber is filled with absorber material, e.g. flowable material that is subsequently cured. Then, the metallic lid may be machined again in order to re-mill the shielding chamber to a desired depth and width leaving some absorber material on the ceiling and/or walls and to mill out the supply channels.

According to an embodiment, the RF-absorber material may be removed from the shielding chamber and the at least one supply channel may be machined out such that the ceiling of the shielding chamber covered with RF-absorber material runs flush with a ceiling of the at least one supply channel.

In other words, the shielding chamber is not necessarily formed as a recess within the metallic lid compared to the supply channels. Instead, the shielding chamber may be arranged flush with the supply channels.

According to an embodiment, several supply channels may be formed into the underside of the metallic lid such that they meet within the shielding chamber in a star-shaped configuration.

The electronic component accommodated within the shielding chamber may thus be contacted from all lateral sides of the shield housing as may be demanded in a respective use case.

According to an embodiment, several sealing cords may be integrated as sealing gasket into the underside of the metallic lid between the shielding chamber and a lateral edge of the metallic lid.

The sealing gasket provides additional electromagnetic damping for the shield housing. To this end, the sealing cords may be made of a suitable material, e.g. a highly electrically conductive foam with or without an electrically conductive self-adhesive strip on one side.

According to an embodiment, the sealing cords may be inserted into respective sealing grooves within the underside of the metallic lid.

The grooves may be formed by machining during manufacturing of the metallic lid, for example. The sealing cords may then be inserted into the grooves already during this production step. For example, self-adhesive foam strips may be used for this purpose.

According to an embodiment, the sealing cords may be formed into the sealing grooves by dispensing a sealing material in flowable condition.

Alternatively, or additionally, the sealing cords may thus also be formed by filling in a suitable material into the sealing grooves that is subsequently cured within the grooves prior to the further production steps of the shield housing.

BRIEF DESCRIPTION OF THE DRAWINGS

For a more complete understanding of the present invention and advantages thereof, reference is now made to the following description taken in conjunction with the accompanying drawings. The invention is explained in more detail below using exemplary embodiments which are specified in the schematic figures of the drawings, in which.

Figure 1:
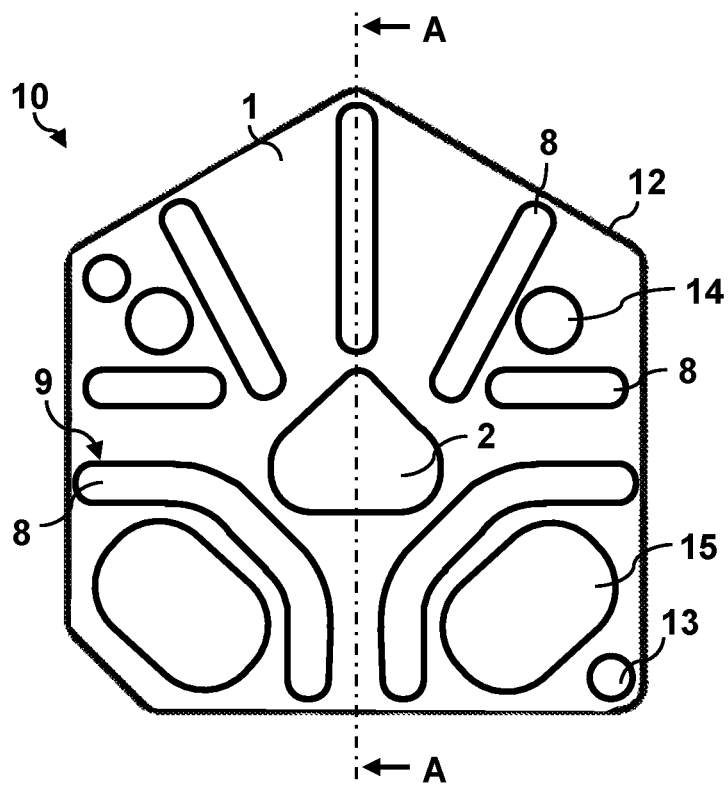
FIGS. 1 to 4 show bottom views of an electromagnetic shield housing according to an embodiment of the present invention during successive manufacturing steps.
Figure 2:
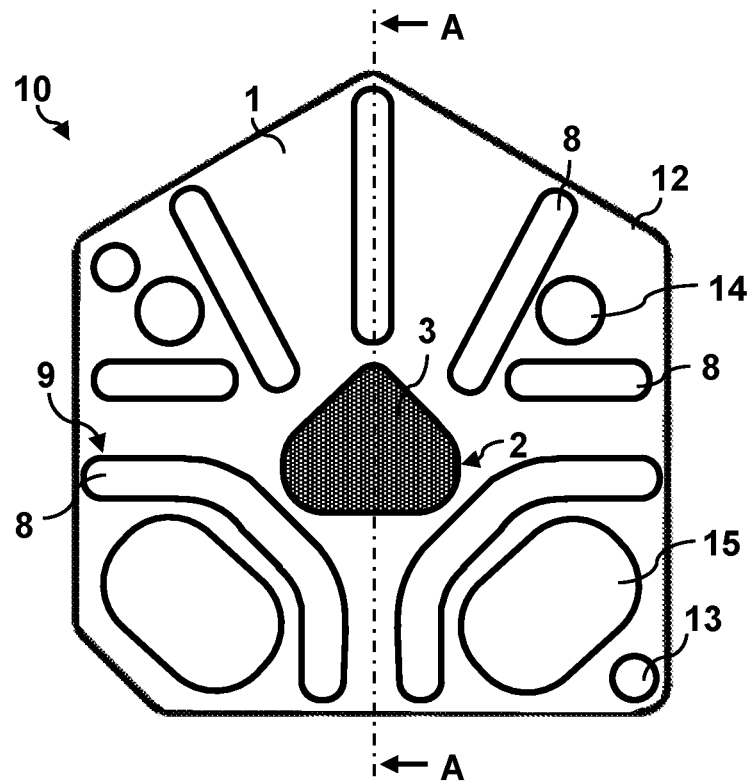
Figure 3:
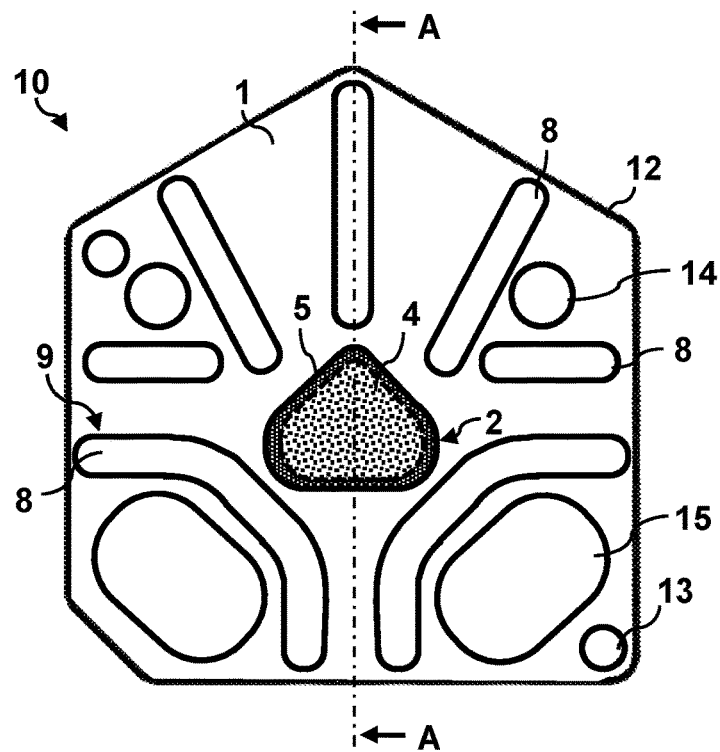

The appended drawings are intended to provide further under-standing of the embodiments of the invention. They illustrate embodiments and, in conjunction with the description, help to explain principles and concepts of the invention. Other embodiments and many of the advantages mentioned become apparent in view of the drawings. The elements in the drawings are not necessarily shown to scale.

In the drawings, like, functionally equivalent and identically operating elements, features and components are provided with like reference signs in each case, unless stated otherwise.

DETAILED DESCRIPTION OF THE DRAWINGS

Figure 5:
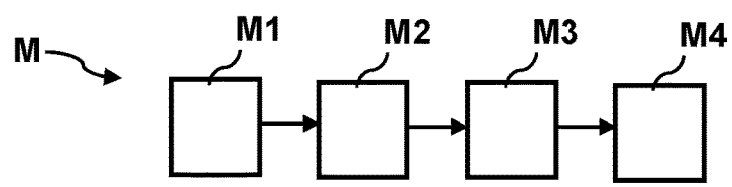
FIG. 5 shows a schematic flow diagram of an embodiment of a method according to the present invention for manufacturing the electromagnetic shield housing of FIGS. 1 to 4.
Figure 6:
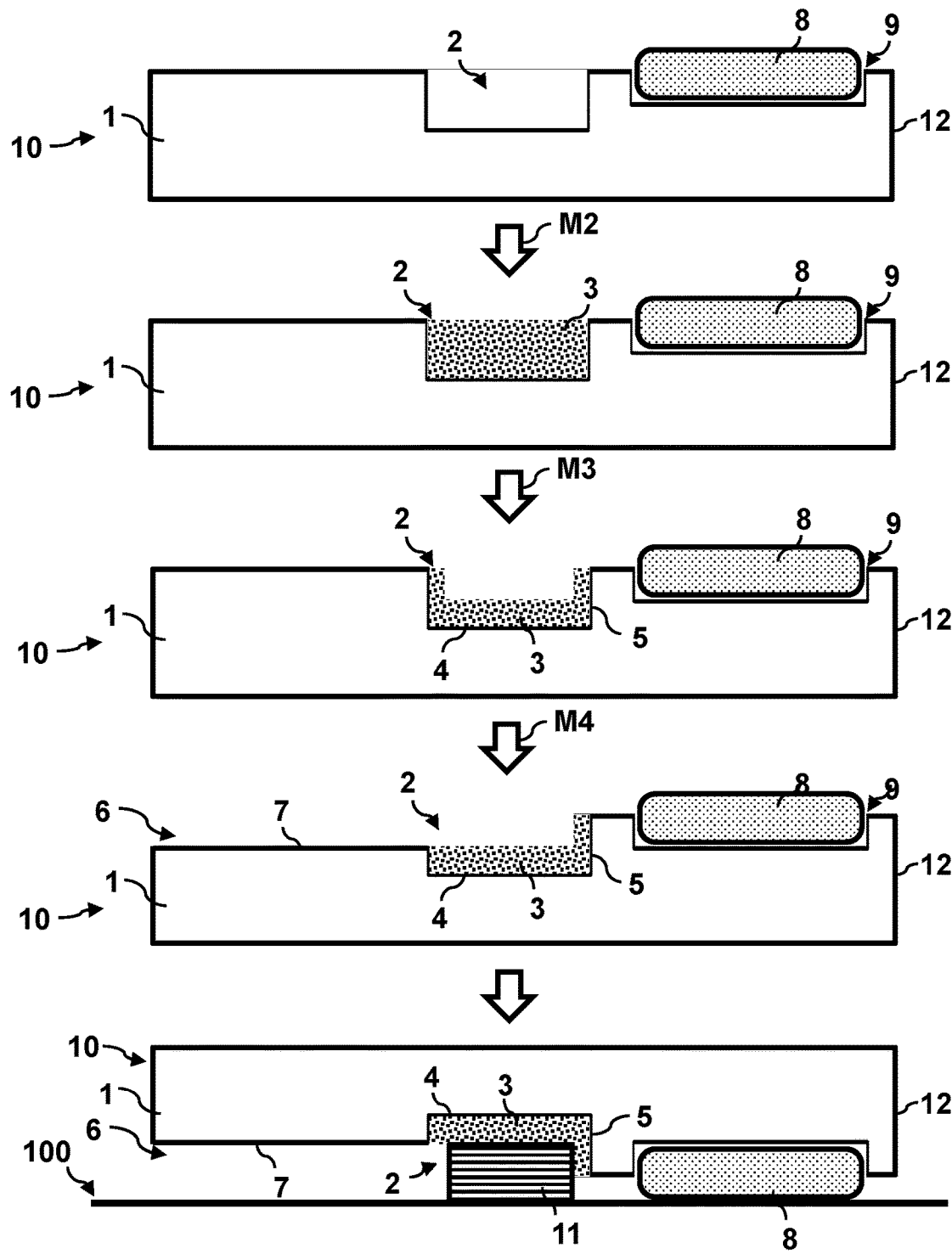
FIG. 6 depicts respective side views showing the electromagnetic shield housing of FIGS. 1 to 4 during manufacturing.

FIGS. 1 to 4 show bottom views of an electromagnetic shield housing 10 according to an embodiment of the present invention during successive manufacturing steps. FIG. 6 shows respective side views depicting the electromagnetic shield housing of FIGS. 1 to 4 during manufacturing. FIG. 5 shows a schematic flow diagram of an embodiment of a method M according to the present invention for manufacturing the electromagnetic shield housing 10 of FIGS. 1 to 4.

The electromagnetic shield housing 10 is provided for shielding an electronic component 11 on a printed circuit board 100 and suppress various electromagnetic interference effects including TEm0p resonances but also lateral TE0np resonances as well as excitations of TM modes, which may arise due increasing miniaturization of printed circuit boards at higher frequencies.

FIGS. 8 to 11 show different types of resonances for an exemplary electromagnetic shield housing 10', which surrounds a cavity 17 above a printed circuit board 100, the cavity 17 being connected to the outside via supply lines 6 (RF feeds).

Figure 8:
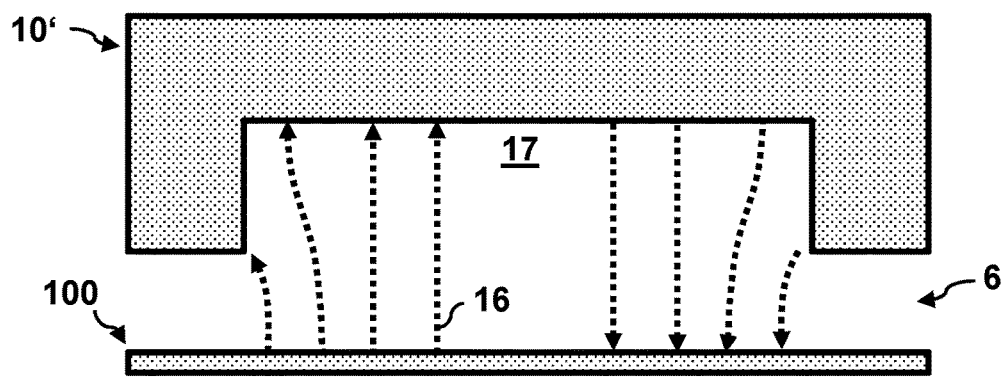
FIGS. 8 to 11 show different types of resonances for an exemplary electromagnetic shield housing.
Figure 9:
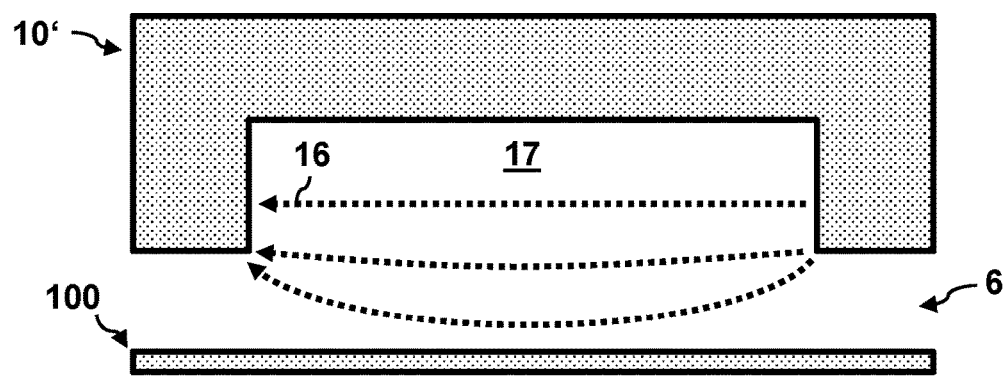
Figure 10:
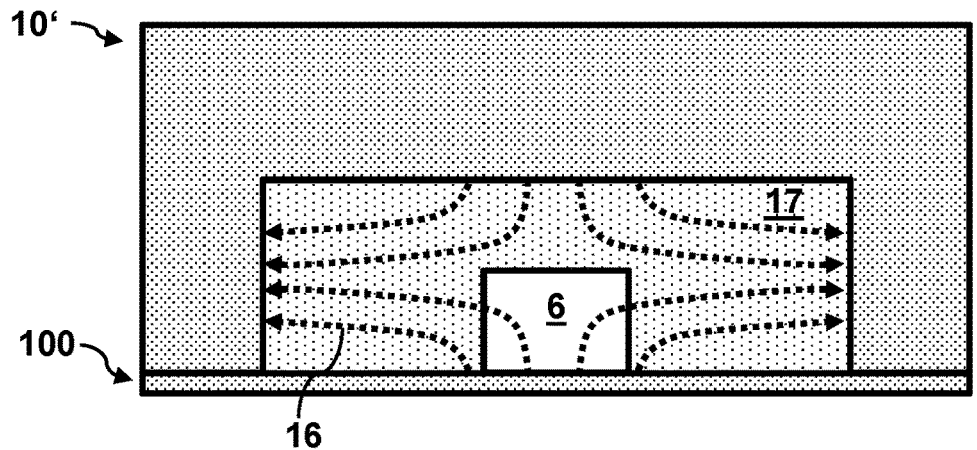
Figure 11:
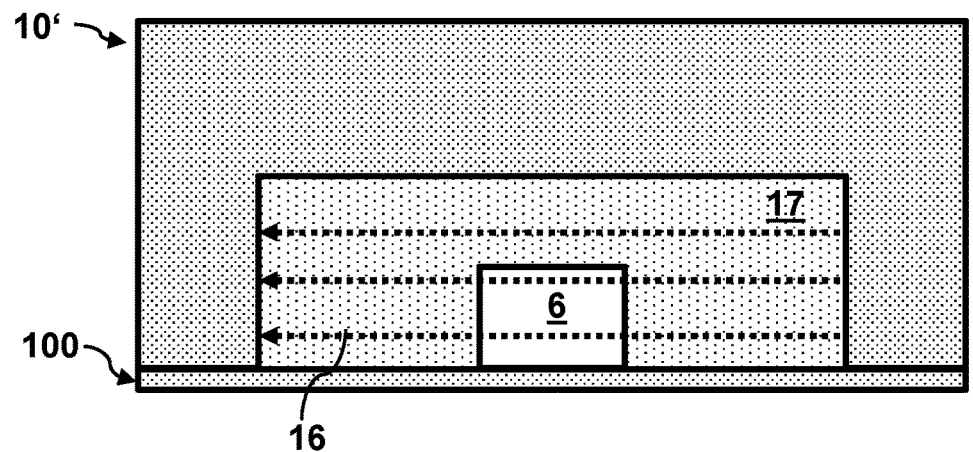

In the example of FIG. 8, a TE102 resonance occurs, which means that the corresponding electric field lines 16 are oriented perpendicular with respect to the surface of the printed circuit board 100. FIGS. 9 to 12 on the other hand depict examples where the electric field lines 16 may also run parallelly to the printed circuit board: FIG. 9 is a TM110 resonance, FIG. 10 a TE111 resonance and FIG. 11 a TE011 resonance.

Figure 12:
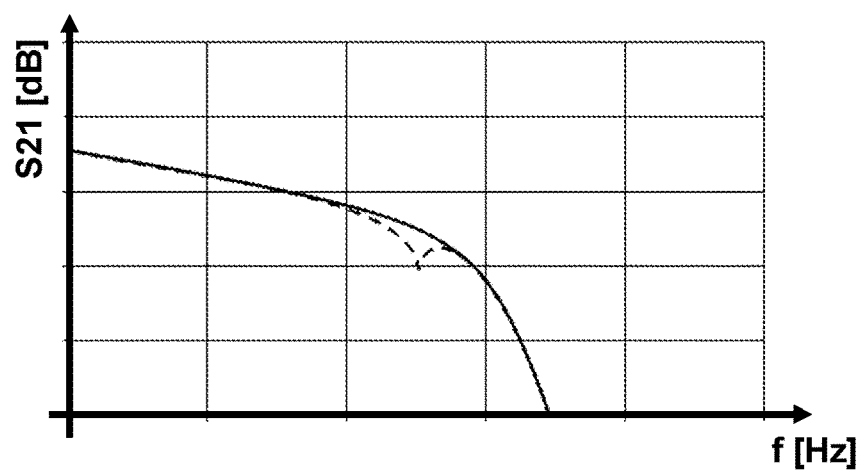
FIG. 12 depicts transferred power as a function of frequency for two exemplary cases.

Occurrence of such electromagnetic disturbances may generate a dip within the power spectrum, as illustrated in FIG. 12, which shows the transferred power as a function of the frequency for a perfectly shielded example (solid line) and an example with less-than-optimal shielding (dashed line).

In order to suppress the respective excitations, it is hence not enough to suppress electromagnetic waves in a perpendicular direction (with respect to the extension of the PCB 100). These also need to be eliminated in lateral direction across the PCB 100. Therefore, RF-absorbing and/or RF-damping material 3 needs to be arranged not only above the respective electronic component 11 but also on its lateral sides. Coverage of the electronic component 11 with shielding material should be as hermetic as possible in these directions.

To this end, the electromagnetic shield housing 10 comprises a metallic lid 1 configured with a shielding chamber 2 at an underside for accommodating and covering the electronic component 11 on the printed circuit board 100. The shielding chamber 2 comprises a ceiling 4 and lateral walls 5 continuously covered with RF-absorber material 3. In this case, the RF-absorber material 3 in fact forms a single continuous surface within the shielding chamber 2 across the ceiling 4 and the lateral walls 5.

Contrary to conventional solutions where damping mats are glued into the ceilings of respective chambers, in the present case the RF-absorber material 3 is dispensed into the shielding chamber 2 in flowable condition and subsequently cured there to cover not only the ceiling 4 but also the walls 5 of the respective chamber 2. In other words, an adhesive is not required, which could otherwise adversely affect the damping properties of the RF-absorber material 3.

As illustrated in FIG. 5, the presently followed approach comprises three basic manufacturing steps to accomplish this. First, the method M comprises under M1 providing a metallic lid 1 with a shielding chamber 2 at an underside for accommodating and covering the electronic component 11 on the printed circuit board 100 (cf. FIG. 1 and FIG. 6 at the top). Next, the method M comprises under M2 filling the shielding chamber 2 with an RF-absorber material 3 (cf. FIG. 2 and FIG. 6 second from top). Then, the method M comprises under M3 removing RF-absorber material 3 from the shielding chamber 2 until the electronic component 11 fits into the shielding chamber 2 while a ceiling 4 and lateral walls 5 of the shielding chamber 2 remain covered with RF-absorber material 3 (cf. FIG. 3 and FIG. 6 in the middle).

Thus, the present solution offers the particular advantage that the ceiling 4 as well as the lateral walls 5 of the shielding chamber 2 can be continuously covered with shielding material without having to rely on any laborious and/or manual manufacturing techniques. Instead, the RF-absorber material 3 can be applied and removed using standard machining techniques. For example, the RF-absorber material 3 can be removed from the shielding chamber 2 by milling.

Suitable RF-absorber materials 3 comprises amongst others polymer composites having a polymer matrix filled with a metal material, e.g. Manganese zinc ferrites embedded in an epoxy or polyurethane or other polymer-based matrix. It is to be understood, however, that the person of skill may use any absorber/shielding material adequate for this purpose that can be dispensed into the shielding chamber 2.

In the illustrated embodiment, the method M further comprises under M4 machining out, e.g. by milling, several supply channels 6 along the underside of the metallic lid 1 for accommodating respective electromagnetic signal lines (not shown). Each such supply channel 6 runs from a lateral edge 12 of the metallic lid 1 into the shielding chamber 2 through the RF-absorber material 3 of the walls 5 of the shielding chamber 2 (cf. FIG. 4 and FIG. 6 second from bottom).

Figure 4:
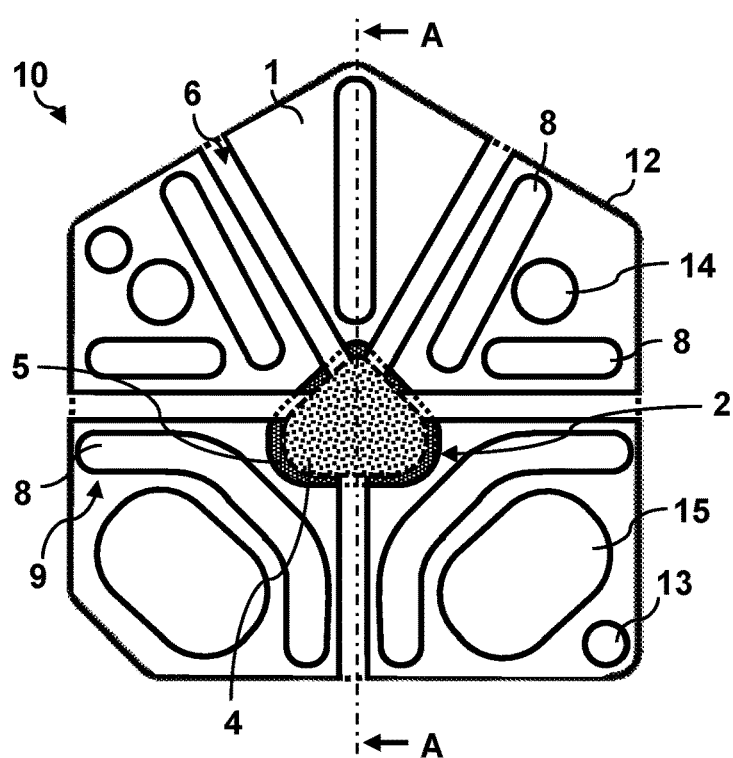

The supply channels 6 are formed into the underside of the metallic lid 1 such that they meet within the shielding chamber 2 in a star-shaped configuration, as can be seen in FIG. 4. In the embodiment of FIG. 6, the RF-absorber material 3 is removed from the shielding chamber 2 and the at least one supply channel 6 is machined out such that the ceiling 4 of the shielding chamber 2 covered with RF-absorber material 3 runs flush with a ceiling 7 of the supply channels 6.

Figure 7:
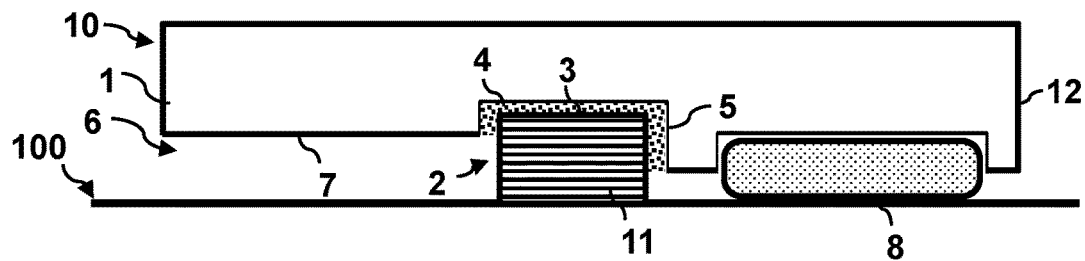
FIG. 7 shows a side view of an electromagnetic shield housing according to an alternative embodiment of the invention.

In other embodiments, however, the shielding chamber 2 may also be recessed with respect to the supply channels 6. FIG. 7 shows such an alternative embodiment. As can be seen there, the shielding chamber 2, and thus also the electronic component 11 accommodated therein, protrudes into the metallic lid 1 with respect to the ceiling 7 of the supply channels 6.

The thus formed shield housing 10 can be further furnished with additional structural and/or functional aspects, as required or desired for the respective application at hand.

For example, several sealing cords 8 may be integrated into the underside of the metallic lid 1 between the shielding chamber 2 and the lateral edge 12 of the metallic lid 1 to serve as sealing gasket.

In the embodiments of FIGS. 1 to 7, the sealing cords 8 are inserted into respective sealing grooves 9 within the underside of the metallic lid 1. For example, the sealing cords 8 may be formed into the sealing grooves 9 by dispensing a conductive sealing material in flowable condition. In other examples, the sealing cords 8 may be formed by gluing suitable material into the sealing grooves 9, e.g. a self-adhesive conductive foam cord or similar.

The sealing cords 8 may already be formed and/or installed during production of the metallic lid 1 and before the RF-absorber material 3 is poured into the shielding chamber 2. In principle, however, it is left to the person of skill to decide at which point during the manufacturing process certain structures and elements are integrated into the shield housing 10.

In FIGS. 1 to 4 additional exemplary elements and structures are shown to demonstrate that the person of skill may further furnish the shielding housing 10 as demanded by each respective use case. For example, the metallic lid 1 may be additionally provided with alignment elements 13 (e.g. alignment pins) and/or fastening portions 14 (e.g. screw holes) as well as functional portions 15 (e.g. recesses for additional elements).

Finally, the electromagnetic shield housing 10 is then placed over an electronic component 11 on a printed circuit board 100 such that the electronic component 11 is accommodated in the shielding chamber 2 of the electromagnetic shield housing 10 and thereby covered by the electromagnetic shield housing 10 (cf. FIG. 6 at the bottom, as well as FIG. 7).

As a result, the electronic component 11 is now much better shielded against electromagnetic interference at high frequencies than in case of conventional solutions. Consequently, the printed circuit board 100 may be realized with high integration density and high dynamics yet leaving some flexibility with regards to the size of the surface mounted components.

Although specific embodiments have been illustrated and described herein, it will be appreciated by those of ordinary skill in the art that a variety of alternate and/or equivalent implementations exist. It should be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without de-parting from the scope as set forth in the appended claims and their legal equivalents. Generally, this application is intended to cover any adaptations or variations of the specific embodiments discussed herein.

In the foregoing detailed description, various features are grouped together in one or more examples or examples for the purpose of streamlining the disclosure. It is understood that the above description is intended to be illustrative, and not restrictive. It is intended to cover all alternatives, modifications and equivalents as may be included within the scope of the invention. Many other examples will be apparent to one skilled in the art upon reviewing the above specification.

Specific nomenclature used in the foregoing specification is used to provide a thorough understanding of the invention. However, it will be apparent to one skilled in the art in light of the specification provided herein that the specific details are not required in order to practice the invention. Thus, the foregoing descriptions of specific embodiments of the present invention are presented for purposes of illustration and description. They are not intended to be exhaustive or to limit the invention to the precise forms disclosed; obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. Throughout the specification, the terms "including" and "in which" are used as the plain-English equivalents of the respective terms "comprising" and "wherein," respectively. Moreover, the terms "first," "second," and "third," etc., are used merely as labels, and are not intended to impose numerical requirements on or to establish a certain ranking of importance of their objects.

The invention claimed is:

1. A method for manufacturing an electromagnetic shield housing for shielding an electronic component on a printed circuit board, the method comprising:
   providing a metallic lid with a shielding chamber at an underside for accommodating and covering the electronic component on the printed circuit board;
   filling the shielding chamber with an RF-absorber material, wherein the RF-absorber material is filled into the shielding chamber in flowable condition and subsequently cured therein; and
   removing cured RF-absorber material from the shielding chamber until the electronic component fits into the shielding chamber while a ceiling and lateral walls of the shielding chamber remain covered with cured RF-absorber material; and
   machining out at least one supply channel along the underside of the metallic lid for accommodating respective electromagnetic signal lines, the at least one supply channel running from a lateral edge of the metallic lid into the shielding chamber through the RF-absorber material of the walls of the shielding chamber.

2. The method of claim 1, wherein the RF-absorber material forms a single continuous surface within the shielding chamber across the ceiling and the lateral walls.

3. The method of claim 1, wherein the RF-absorber material is a polymer composite having a polymer matrix filled with a metal material, the metal material particularly comprising at least one of manganese and zinc.

4. The method of claim 1, wherein the RF-absorber material is removed from the shielding chamber by machining.

5. The method of claim 1, wherein the RF-absorber material is removed from the shielding chamber and the at least one supply channel is machined out such that the ceiling of the shielding chamber covered with RF-absorber material runs flush with a ceiling of the at least one supply channel.

6. The method of claim 1, wherein several supply channels are formed into the underside of the metallic lid such that said supply channels meet within the shielding chamber in a star-shaped configuration.

7. The method of claim 1, further comprising several sealing cords integrated as sealing gasket into the underside of the metallic lid between the shielding chamber and a lateral edge of the metallic lid.

8. The method of claim 7, wherein the sealing cords are inserted into respective sealing grooves within the underside of the metallic lid.

9. The method of claim 8, wherein the sealing cords are formed into the sealing grooves by dispensing a sealing material in flowable condition.

10. An electromagnetic shield housing for shielding an electronic component on a printed circuit board, the electromagnetic shield housing comprising:
- a metallic lid configured with a shielding chamber at an underside for accommodating and covering the electronic component on the printed circuit board, wherein the shielding chamber comprises a ceiling and lateral walls covered with RF-absorber material,
- wherein the RF-absorber material is a castable magnetic polymer composite having a polymer matrix filled with a metal material;
- wherein at least one supply channel is formed along the underside of the metallic lid for accommodating respective electromagnetic signal lines, the at least one supply channel running from a lateral edge of the metallic lid into the shielding chamber through the RF-absorber material of the walls of the shielding chamber.

11. The electromagnetic shield housing of claim 10, wherein the RF-absorber material forms a single continuous surface within the shielding chamber across the ceiling and the lateral walls.

12. The electromagnetic shield housing of claim 10, wherein the metal material comprises at least one of manganese and zinc.

13. The electromagnetic shield housing of claim 10, wherein the ceiling of the shielding chamber covered with RF-absorber material runs flush with a ceiling of the at least one supply channel.

14. The electromagnetic shield housing of claim 10, wherein several supply channels are formed into the underside of the metallic lid such that said supply channels meet within the shielding chamber in a star-shaped configuration.

15. The electromagnetic shield housing of claim 10, further comprising several sealing cords integrated as sealing gasket into the underside of the metallic lid between the shielding chamber and a lateral edge of the metallic lid.

16. A printed circuit board having the electronic component attached thereon and an electromagnetic shield housing according to claim 10 being placed over the electronic component such that the electronic component is accommodated in the shielding chamber of the electromagnetic shield housing and thereby covered by the electromagnetic shield housing.

17. The electromagnetic shield housing of claim 15, wherein the sealing cords are inserted into respective sealing grooves within the underside of the metallic lid.

* * * * *